US012604114B2

(12) United States Patent
Xhakoni

(10) Patent No.: US 12,604,114 B2
(45) Date of Patent: Apr. 14, 2026

(54) IMAGING DEVICE, OPTOELECTRONIC DEVICE AND METHOD FOR OPERATING AN IMAGING DEVICE

(71) Applicant: ams Sensors Belgium BVBA, Berchem (BE)

(72) Inventor: Adi Xhakoni, Kessel Lo (BE)

(73) Assignee: ams Sensors Belgium BVBA, Berchem (BE)

( * ) Notice: Subject to any disclaimer, the term of this patent is extended or adjusted under 35 U.S.C. 154(b) by 32 days.

(21) Appl. No.: 18/836,763

(22) PCT Filed: Jan. 24, 2023

(86) PCT No.: PCT/EP2023/051606
§ 371 (c)(1),
(2) Date: Aug. 8, 2024

(87) PCT Pub. No.: WO2023/151934
PCT Pub. Date: Aug. 17, 2023

(65) Prior Publication Data
US 2025/0142230 A1     May 1, 2025

(30) Foreign Application Priority Data
Feb. 9, 2022    (DE) ......................... 102022103038.5

(51) Int. Cl.
*H04N 25/771* (2023.01)
*H04N 25/59* (2023.01)
(Continued)

(52) U.S. Cl.
CPC ........... *H04N 25/771* (2023.01); *H04N 25/59* (2023.01); *H04N 25/616* (2023.01);
(Continued)

(58) Field of Classification Search
None
See application file for complete search history.

(56) References Cited

U.S. PATENT DOCUMENTS

| | | |
|---|---|---|
| 6,317,154 B2 | 11/2001 | Beiley |
| 8,754,357 B2 | 6/2014 | Meynants et al. |

(Continued)

FOREIGN PATENT DOCUMENTS

| | | |
|---|---|---|
| CN | 111416953 A | 7/2020 |
| DE | 102015003134 B4 | 10/2015 |

(Continued)

OTHER PUBLICATIONS

Search Report of corresponding German Patent Application No. 10 2022 103 038.5, dated Dec. 9, 2022, 7 pages (for informational purposes only).

(Continued)

*Primary Examiner* — James M Hannett
(74) *Attorney, Agent, or Firm* — Viering, Jentschura & Partner mbB

(57) ABSTRACT

An imaging device includes a plurality of pixels. The pixels include: a photosensitive stage, including a photodetector and a diffusion node electrically coupled to the photodetector via a transfer switch; a sample-and-hold stage including a first source follower, wherein a gate terminal of the first source follower is electrically connected to the diffusion node, and further including a pair of switchable capacitors that are electrically coupled to an output terminal of the first source follower; a readout stage, wherein an input of the readout stage is electrically coupled to an output of the sample-and-hold stage; and an electrical interconnection including an gain switch, that is electrically connected to the diffusion node and to a first terminal of one of the capacitors.

19 Claims, 5 Drawing Sheets

(51) Int. Cl.

| | |
|---|---|
| *H04N 25/616* | (2023.01) |
| *H04N 25/621* | (2023.01) |
| *H10F 39/00* | (2025.01) |
| *H04N 25/65* | (2023.01) |

(52) U.S. Cl.
CPC ......... *H04N 25/621* (2023.01); *H10F 39/811* (2025.01); *H04N 25/65* (2023.01)

(56) References Cited

U.S. PATENT DOCUMENTS

| | | | |
|---|---|---|---|
| 9,666,618 | B2 | 5/2017 | Meynants |
| 9,756,271 | B2 | 9/2017 | Luo et al. |
| 10,608,101 | B2 | 3/2020 | Liu |
| 10,791,291 | B2 | 9/2020 | Oh et al. |
| 10,791,292 | B1 * | 9/2020 | Geurts ................. H04N 25/771 |
| 10,917,596 | B2 | 2/2021 | Oh et al. |
| 11,094,726 | B2 | 8/2021 | Simony |
| 11,128,829 | B2 | 9/2021 | Oh et al. |
| 11,153,524 | B1 | 10/2021 | Yen et al. |
| 11,172,153 | B2 | 11/2021 | Oh et al. |
| 11,212,475 | B2 | 12/2021 | Simony et al. |
| 2004/0096124 | A1 | 5/2004 | Nakamura |
| 2005/0270394 | A1 | 12/2005 | Dierickx et al. |
| 2008/0036889 | A1 | 2/2008 | Yamada et al. |
| 2009/0256060 | A1 * | 10/2009 | Meynants ............ H04N 25/771 250/214 A |
| 2013/0314573 | A1 * | 11/2013 | Tsukimura ........... H04N 25/616 348/302 |
| 2014/0239161 | A1 | 8/2014 | Meynants et al. |
| 2016/0088251 | A1 | 3/2016 | Luo et al. |
| 2017/0048469 | A1 | 2/2017 | Xiong et al. |
| 2017/0104946 | A1 | 4/2017 | Hong |
| 2018/0070030 | A1 * | 3/2018 | Geurts ................. H04N 25/532 |
| 2018/0227516 | A1 | 8/2018 | Mo et al. |
| 2018/0331140 | A1 | 11/2018 | Sato |
| 2019/0094394 | A1 | 3/2019 | Matsumoto |
| 2020/0382738 | A1 | 12/2020 | Malinge et al. |
| 2021/0014444 | A1 * | 1/2021 | Geurts ................. H04N 25/78 |
| 2021/0160448 | A1 | 5/2021 | Seo et al. |
| 2021/0235027 | A1 * | 7/2021 | Meynants ............. H04N 25/78 |

FOREIGN PATENT DOCUMENTS

| | | | |
|---|---|---|---|
| DE | 202016105510 | U1 | 10/2016 |
| EP | 2109306 | A2 | 10/2009 |
| EP | 3445039 | A1 | 2/2019 |
| EP | 3605606 | A1 | 2/2020 |
| EP | 3930309 | A1 | 12/2021 |
| WO | 2019/036237 | A1 | 2/2019 |
| WO | 2019/155699 | A1 | 8/2019 |
| WO | 2021/185190 | A1 | 9/2021 |
| WO | 2021/259744 | A1 | 12/2021 |

OTHER PUBLICATIONS

International Search Report for corresponding International Patent Application No. PCT/EP2023/051606, dated Mar. 21, 2023, 4 pages (for informational purposes only).

Search Report of corresponding Taiwanese Patent Application No. 112104099, dated Aug. 22, 2023, 1 page (for informational purposes only).

* cited by examiner

IMAGING DEVICE, OPTOELECTRONIC DEVICE AND METHOD FOR OPERATING AN IMAGING DEVICE

RELATED APPLICATIONS

This application is a US National Stage of International Application PCT/EP2023/051606, filed on 24 Jan. 2023 and claims priority under 35 U.S.C. § 119(a) and 35 U.S.C. § 365(b) from German patent application DE 10 2022 103 038.5 filed on 9 Feb. 2022, the contents of which are incorporated herein by reference in their entirety

FIELD

Embodiments of the present disclosure relate to an imaging device, an optoelectronic device and a method for operating an imaging device.

BACKGROUND

CMOS imagers are used in a wide range of applications, some of which require a high dynamic range (HDR). The dynamic range (DR) is limited on the one side by the noise floor at low light conditions, and by saturation effects at high light conditions on the other side.

Most of the available DR techniques are designed for rolling shutter pixels, but not being global shutter friendly. In global shutter mode all the pixels of a pixel matrix are exposed during the same time period. At the end of integration time, the charge transfer operations for all rows of the pixel matrix happen simultaneously. The signals are stored in a pixel level memory and subsequently read out.

Some of the available DR techniques for global shutter pixels require a plurality of memory elements on pixel level. For example, storage capacitors are used as memory elements. Storage capacitors, however, require a large space within the pixel, such that the pixel size is increased. Thus, integrating a plurality of storage capacitors inside each pixel comes at the expense of a degraded image quality. An object to be achieved is to provide a space-saving imaging device with a high dynamic range and a method for operating such an imaging device. A further object is to provide an optoelectronic device comprising the imaging device.

SUMMARY

Here and in the following, the term "pixel" refer to a light receiving element, which might be arranged in a two-dimensional array, also called matrix, with other pixels. Pixels in the array are arranged in rows and columns. The terms "row" and "column" can be used interchangeably, since they depend only on the orientation of the pixel array. The pixel might also include circuitry for controlling signals to and from the pixel. Thus, the pixel may form a so-called active pixel. The pixel may receive light in an arbitrary wavelength range. The term "light" may refer to electromagnetic radiation in general, including infrared (IR) radiation, ultraviolet (UV) radiation and visible (VIS) light, for example. Further, here and in the following, the terms "electrically connected" and "electrically coupled" may refer to a direct connection between two electrical components, i.e. to an electrical connection of two components without further components in between. Alternatively, it may also refer to an indirect electrical connection via further components. Generally, "electrically connected" means a direct connection, while "electrically coupled" means an indirect connection.

In an embodiment, an imaging device comprises a plurality of pixels. As mentioned above, the pixels may be arranged in a two-dimensional array comprising rows and columns. The pixels may be implemented as active pixels. By means of the active pixel array an image of a scene can be generated.

In an embodiment, each pixel of the plurality of pixels comprises a photosensitive stage. The photosensitive stage comprises a photodetector configured to accumulate charge carriers by converting electromagnetic radiation. For example, the photodetector comprises a photodiode, in particular a pinned photodiode. The photodetector can also comprise two photodiodes or at least two photodiodes. The photodiode or the at least two photodiodes may be arranged in a substrate, in particular a semiconductor substrate. Photodiodes can detect electromagnetic radiation.

In an embodiment, the photosensitive stage further comprises a diffusion node that is electrically coupled to the photodetector via a transfer switch. The diffusion node may be implemented as floating diffusion (FD) node. The diffusion node may be called FD node. The diffusion node comprises a capacitance. The capacitance forms a storage element of the pixel. The diffusion node may be formed by a doped well in the semiconductor substrate or by a storage capacitor. If the photodetector comprises more than one photodiode, the photodiodes may share a common diffusion node. The transfer switch may be implemented as transistor and may be called in the following transfer transistor. The transfer transistor comprises a first terminal that is electrically connected to a terminal of the photodetector, in particular to a cathode terminal of the photodiode. A second terminal of the transfer transistor is electrically connected to the diffusion node. A gate terminal of the transfer transistor is configured to receive a transfer signal. By applying the transfer signal to the transfer gate the transfer transistor becomes conductive, such that charge carriers diffuse from the photodiode towards the diffusion node. By triggering the transfer towards the diffusion node, the integration time of the respective photodiode can be defined. If the photodetector comprises more than one photodiode, e.g. two photodiodes, each photodiode may be assigned to a respective transfer switch as described above.

In an embodiment, each pixel of the plurality of pixels further comprises a sample-and-hold stage. The sample-and-hold stage may be called S/H stage. The S/H stage comprises a first source follower. The first source follower may also be called common-drain amplifier. A gate terminal of the first source follower is electrically connected to the FD node and serves as input of the S/H stage. A drain terminal of the first source follower may be electrically connected to a positive supply voltage source, VDD. The first source follower further comprises a source terminal, which is configured to provide an electrical signal based on the accumulated charge carriers from the photodetector. The first source follower may be used as voltage buffer and configured to buffer the signal, thus to decouple the FD node from the S/H stage. The first source follower may further be configured to amplify light-induced charge signals and reset levels.

In an embodiment, the S/H stage further comprises a switchable first capacitor and a switchable second capacitor. In particular, the S/H stage may comprise exactly two capacitors. For example, the capacitors may be implemented as metal-oxide-semiconductor (MOS) capacitors. Alternatively, the capacitors may be formed as metal-insulatormetal (MIM) capacitors. Further, the capacitors may be implemented as metal fringe capacitors or as so-called poly-N capacitors. Other capacitor technologies are possible as well. That the capacitors are switchable can mean that a first terminal of each capacitor is electrically connected to a switch. For example, a first terminal of the first capacitor is electrically connected to a first switch, and a first terminal of the second capacitor is electrically connected to a second switch. A second terminal of the first capacitor and a second terminal of the second capacitor may be electrically connected to respective reference voltage source. The first and the second capacitor may be arranged cascaded or in parallel, as further explained below. The first and the second capacitor are electrically coupled to an output terminal of the first source follower. The output terminal of the first source follower may be the source terminal. For example, the first terminal of the first capacitor may be electrically coupled to the source terminal of the first source follower via the first switch, and the first terminal of the second capacitor may be electrically coupled to the source terminal of the first source follower via the second switch (and via the first switch, if the capacitors are arranged cascaded). As such, electrical signals based on the charge signals generated at the photosensitive stage can be stored on the capacitors of the S/H stage. The S/H stage stores the electrical signals in a voltage domain. This can mean that the S/H stage stores altered versions of the charge signals from the photodetector. In particular, charge signals generated by the photodetector may be amplified or attenuated and/or transformed into respective voltage signals before being stored on capacitors of the S/H stage. It may be desired to store the signals in the voltage domain rather than in the charge domain for dark current reasons and to reduce the parasitic light sensitivity (PLS) of the pixel. Further, by the pixel intern storage capacitors, global shutter readout can be applied to each pixel. Thus, the pixel may form a global shutter (GS) pixel.

In an embodiment, each pixel of the plurality of pixels further comprises a readout stage. An input of the readout stage is electrically coupled to an output of the sample-and-hold stage. A possible implementation of the readout stage is described below. The output of the S/H stage may be formed by the first terminal of the first capacitor and/or by the first terminal of the second capacitor. At the output of the S/H stage the electrical signals stored on the first and the second capacitor are provided. By means of the readout stage the electrical signals stored on the capacitors can be forwarded to a readout circuit. For example, the readout circuit comprises an ADC and/or control circuits. The readout circuit can be arranged on the same semiconductor substrate, or may be arranged on a separate chip. The readout circuit is not part of the pixel, but may be comprised by the imaging device.

In an embodiment, each pixel of the plurality of pixels further comprises an electrical interconnection. The electrical interconnection spans from the diffusion node to the first terminal of the second capacitor. The electrical interconnection comprises a gain switch. The gain switch may be implemented as transistor and may be called gain transistor. A first terminal of the gain switch is electrically connected to the diffusion node and a second terminal of the gain switch is electrically connected to the first terminal of the second capacitor. If the gain switch is implemented as transistor, the transistor further comprises a gate terminal, which may be called gain gate. The gain gate is configured to receive a gain signal. By applying the gain signal or, respectively, by activating the gain switch, the gain switch is in a conductive state, such that electrical signals are forwarded from the diffusion node to the first terminal of the second capacitor, or vice versa. Moreover, if the gain switch is implemented as transistor, the gain gate can be pulsed to certain voltage levels. Thus, a potential barrier of the gain transistor can be modulated, such that a signal transfer between the diffusion node and the second capacitor can be controlled.

By the electrical interconnection and the gain switch the second capacitor (and in some embodiments also the first capacitor) can be used for more operations and various purposes: For example, as in normal operation of the pixel, the second capacitor may be configured to store a reset level of the pixel, while the first capacitor may be configured to store a video signal (e.g. a low light signal corresponding to low light conditions). By providing the reset level of the pixel correlated double sampling (CDS) can be performed to remove noise from a video signal, in particular the low light signal.

Moreover, during pixel exposure, if the photodetector saturates, charge carriers may overflow from the photodetector to the diffusion node. The charge carriers may further overflow from the diffusion node to the second capacitor. A charge overflow can mean that the potential barriers formed by the transfer switch and/or by the gain switch are overcome by excess charge carriers, even if these switches are in an open, i.e. non-conductive, state. Thus, the second capacitor can be used as overflow capacitor to store excess charge carriers at high light conditions. Thus, the second capacitor can be used as lateral overflow integration capacitor (LO-FIC). The stored signal may be called high light signal. Thus, at saturation of the photodetector, the excess charge carriers can be evaluated. This increases the dynamic range of the pixel. At low light conditions, i.e. when the light level is low, charge carriers remain in the potential well of the photodetector during pixel exposure, and the low light signal can be evaluated. Further, at saturation of the photodetector, if the potential barrier of the gain switch is modulated by pulsing its gate to certain voltage levels, the charge transfer to the second capacitor can be controlled. Thus, by applying different potential barriers to the gain switch, the dynamic range of the pixel can be further increased.

Moreover, during a storage period of the pixel, the gain switch can be closed to shorten the diffusion node with the first terminal of the second capacitor. By shorting the FD node and the second capacitor a combined capacitance is larger than that of the FD node alone. Keeping the charge constant, this leads to a reduced voltage signal. Thus, the gain is reduced by enlarging the capacitance. This means that the pixel has a reduced gain if the FD node and the second capacitor are shorted. In other words, the pixel has an increased gain if the second capacitor is electrically decoupled from the FD node by an open gain switch. Thus, a dynamic range of the pixel can be increased by applying different gains to charge signals from the photodetector.

The above examples can be combined. Therefore, the second capacitor can be reused for several purposes during operation of the pixel. A total number of storage capacitors can therefore be small, which reduces a total pixel size. In particular, the total number of storage capacitors may be exactly two in each pixel. The imaging device enables HDR operation, for example from about 60 dB up to 90 dB, or up to 100 dB or more than 100 dB. The HDR allows for better highlight and shadow capturing encountered in real world scenes, while maintaining the advantages of a global shutter (GS) implementation, such as low motion artifacts and reduced illumination times.

In an embodiment, an imaging device comprises a plurality of pixels, wherein each pixel of the plurality of pixels comprises a photosensitive stage, a sample-and-hold stage, a readout stage, and an electrical interconnection. The photosensitive stage comprises a photodetector configured to accumulate charge carriers by converting electromagnetic radiation, and a diffusion node electrically coupled to the photodetector via a transfer switch. The sample-and-hold stage comprises a first source follower, wherein a gate terminal of the first source follower is electrically connected to the diffusion node. The sample-and-hold stage further comprises a switchable first capacitor and a switchable second capacitor that are electrically coupled to an output terminal of the first source follower. An input of the readout stage is electrically coupled to an output of the sample-and-hold stage. The electrical interconnection comprises a gain switch, wherein a first terminal of the gain switch is electrically connected to the diffusion node and a second terminal of the gain switch is electrically connected to a first terminal of the second capacitor. In an embodiment, the second capacitor is configured to temporally store a high light signal corresponding to a first amount of charge carriers generated by the photodetector. The first amount of charge carriers may be an amount of excess charge carriers at saturation of the photodiode. The high light signal refers to a signal at high light conditions, i.e. when the light level is high.

In an embodiment, the first capacitor is configured to store a low light signal corresponding to a second amount of charge carriers generated by the photodetector. The second amount of charge carriers may be an amount of charge carriers that remain in the potential well of the photodetector during pixel exposure, i.e. that are not excess charge carriers. For example, the photodiode does not saturate since the light level is low. Thus, the low light signal refers to a signal at low light conditions. In an embodiment, a different conversion gain is used to obtain the low light signal from the second amount of charge carriers than to obtain the high light signal from the first amount of charge carriers.

Since different signals are stored on the first capacitor and on the second capacitor, in particular signals corresponding to low and high light conditions, the dynamic range of the pixel can be increased. It can be determined, based on the values of the stored signals, whether to use the high light signal, the low light signal or a combination of both high light signal and low light signal as pixel output signal.

In an embodiment, the second capacitor is configured to store an adjusted high light signal corresponding to the first amount of charge carriers generated by the photodetector and a reset level. The reset level refers to a non-video signal of the pixel. By resetting the diffusion node, noise is introduced. The reset level of the pixel comprises information about KTC noise, a kind of temporal deviation. Thus, advantageously, temporal noise of the pixel can be determined. The reset level can be used as reference level of a pixel output signal. The adjusted high light signal may be the sum of the high light signal and the reset level. This means that if the high light signal is "zero" (e.g. because no excess charge carriers are present, because the light level is low), the adjusted high light signal may "consist of" the reset level only. If the high light signal is zero, the low light signal may be used as pixel output signal. Correlated double sampling can be performed based on the low light signal and the reset level that is stored as part of the adjusted high light signal.

In an embodiment, the gain switch is configured to short the diffusion node and the first terminal of the second capacitor. As described above, the gain switch may be closed, such that an overall capacitance of the diffusion node and the second capacitance leads to a reduced conversion gain. Further, by shorting the diffusion node and the first terminal of the second capacitor the high light signal stored on the second capacitor may be transferred, during a storage period of the pixel, to the diffusion node via the electrical interconnection. Thus, the high light signal can be adjusted at the diffusion node to become the adjusted high light signal.

In an embodiment, the first capacitor and the second capacitor are arranged cascaded. This can mean that, in the sample-and-hold stage, the first terminal of the first capacitor is electrically coupled to an output terminal (the source terminal) of the first source follower via the first switch, and the first terminal of the second capacitor is electrically coupled to the first terminal of the first capacitor via the second switch. In other words, the second switch is arranged between the first terminal of the first capacitor and the first terminal of the second capacitor. The first terminal of the second capacitor forms an output of the sample-and-hold stage. Advantageously, fewer components are required than in the case of a parallel arrangement of the capacitors.

Alternatively, the first capacitor and the second capacitor (and their respective switches) are arranged the other way around. This can mean that, in the sample-and-hold stage, the first terminal of the second capacitor is electrically coupled to an output terminal (the source terminal) of the first source follower via the second switch, and the first terminal of the first capacitor is electrically coupled to the first terminal of the second capacitor via the first switch. In other words, the first switch is arranged between the first terminal of the first capacitor and the first terminal of the second capacitor. In this case, the first terminal of the first capacitor forms an output of the sample-and-hold stage. Advantageously, fewer components are required than in the case of a parallel arrangement of the capacitors.

In an alternative embodiment, the first capacitor and the second capacitor are arranged in parallel. In that case, both first and second switch are electrically connected to the output terminal (the source terminal) of the first source follower. In other words, the first switch is arranged between the first terminal of the first capacitor and the source terminal of the first source follower, and the second switch is arranged between the first terminal of the second capacitor and the source terminal of the first source follower. Both first terminal of the second capacitor and first terminal of the first capacitor form respective outputs of the sample-and-hold stage. Advantageously, the first capacitor and the second capacitor can be controlled independently by the first and the second switch.

It is also possible that the capacitors are arranged differently than described above. In fact, any pixel which comprises capacitors in a sample-and-hold stage can use the described technique of connecting the diffusion node to one of these capacitors via an electrical interconnection. The disclosure is not limited to a parallel or cascaded arrangement of sample-and-hold capacitors. Rather, the above described arrangements of the capacitors only represent exemplary embodiments. In an embodiment, the photosensitive stage further comprises a reset switch that is electrically connected between the diffusion node and a positive supply voltage source, VDD. The reset switch is configured to reset the diffusion node. The reset switch may be configured to reset the diffusion node before transferring signals to the diffusion node. The reset switch may be implemented as reset transistor. The reset transistor may comprise a first terminal connected to the positive supply voltage source and a second terminal connected to the FD node, and further comprise a reset gate. The positive supply voltage source provides a pixel supply voltage. By applying a reset signal to the reset gate the reset transistor becomes conductive, such that any redundant charge carriers are removed from the diffusion node by applying the supply voltage. In this way, different video signals can be transferred to the diffusion node without interfering.

In an embodiment, the sample-and-hold stage further comprises a precharge switch that is electrically connected between the output terminal of the first source follower and a negative supply voltage source, VSS. The negative supply voltage source provides a negative pixel supply voltage, which can also be ground (GND). The precharge switch may be configured to precharge the first and the second capacitor, which can in particular mean that the capacitors are discharged before new signals are stored. The precharge switch may be implemented as precharge transistor comprising a first terminal connected to the output terminal of the first source follower and a second terminal connected to VSS. By applying a precharge signal to the precharge switch the capacitors can be discharged. The precharge switch can also be implemented as constant current source configured to provide a fixed current.

In an embodiment, a second terminal of the first capacitor is electrically connected to a reference voltage source. In an embodiment, a second terminal of the second capacitor are electrically connected to a further reference voltage source. The reference voltage source and the further reference voltage source provide reference voltages for the capacitors. The reference voltage source and the further reference voltage source may be different. However, the second terminals of the first and second capacitor may also be electrically connected to a common reference voltage source.

In an embodiment, the readout stage comprises a second source follower. The second source follower may also be called second common-drain amplifier. A gate terminal of the first source follower is electrically connected to the output of the sample-and-hold stage and may serve as input of the readout stage. A drain terminal of the second source follower may be electrically connected to the positive supply voltage source, VDD. The second source follower further comprises a source terminal, which is configured to provide an electrical signal based on signals stored on the capacitors of the S/H stage. The second source follower may be used as voltage buffer and configured to buffer the signal, thus to decouple the S/H stage from the readout stage. The second source follower may further be configured to amplify the stored voltage signals (low light signal, adjusted high light signal) and reset levels. In an embodiment, the readout stage further comprises a select switch. The select switch is electrically connected between an output terminal (the source terminal) of the second source follower and a column bus of the imaging device. The column bus may or may not be comprised by the pixel. Alternatively, only a portion of the column bus is comprised by the pixel arrangement. The column bus may be common for each pixel of a column of pixels. The select switch may be implemented as select transistor. A first terminal of the select transistor is electrically connected to the source terminal of the second source follower. A second terminal of the select transistor is electrically connected to the column bus. The select transistor further comprises a select gate. By applying a select signal to the select gate the select transistor becomes conductive, such that a pixel output signal is forwarded via the column bus to the readout circuit. Thus, the pixel may be provided with a global shutter voltage domain readout.

If the first and the second capacitors are arranged cascaded the gate terminal of the second source follower is electrically connected to the first terminal of the first or the second capacitor. However, in case that the first and the second capacitors are arranged in parallel, the readout stage may comprise a further second source follower and a further select switch. All features disclosed for the second source follower and the select gate are also disclosed for the further second source follower and the further select switch. The further second source follower may be electrically connected to the first terminal of the first capacitor via its gate terminal. The further select switch may be electrically connected to the source terminal of the further second source follower. However, the parallel arranged capacitors can also share a common second source follower by means of additional switches.

Furthermore, an optoelectronic device is provided that comprises the imaging device. This means that all features disclosed for the imaging device are also disclosed for and applicable to the optoelectronic device and vice-versa.

The imaging device can be conveniently employed in optoelectronic devices, such as smart phones, tablet computers, laptops, or camera modules. Other applications include augmented reality (AR) and/or virtual reality (VR) scenarios. Further, the image sensor can be implemented in drones or scanning systems, as well as in industrial applications like machine vision. Further, the image sensor is in particular suited to be operated in global shutter mode, as the signals are stored in a pixel level memory. The global shutter mode is in particular suited for infrared applications, where the optoelectronic device further comprises a light source that is synchronized with the pixels. Thus, an optoelectronic device comprising such imaging device may also work in the infrared (IR) domain, for example for 3D imaging and/or identification purposes. Image sensors with infrared sensitivity can be used in dark environments where video feed is required. Such applications reach from mobile phone face unlock to driver monitoring systems. Both can deploy illuminators that are in the short-wave infrared (SWIR) or near-infrared (NIR) spectrum, so that the phone user/driver is not blinded by the light that is illuminating him/her.

Furthermore, a method for operating an imaging device is provided. The imaging device described above can be employed for the method for operating the pixel arrangement described herein. This means that all features disclosed for the imaging device are also disclosed for the method for operating the pixel arrangement and vice-versa.

In an embodiment, a method for operating an imaging device comprising a plurality of pixels is provided. For each pixel of the plurality of pixels the method comprises, during an exposure period, accumulating, at a photosensitive stage, charge carriers by converting electromagnetic radiation with a photodetector.

In an embodiment, the method further comprises, during the exposure period, transferring a first amount of charge carriers from the photodetector via a diffusion node and an electrical interconnection to a second capacitor of a sample-and-hold stage. The first amount of charge carriers might be an amount of excess charge carriers at saturation of the photodetector. The excess charge carriers may overflow potential barriers between the potential well of the photodetector and the potential well of the second capacitor. For example, the potential barriers are formed by a transfer switch between the photodetector and the diffusion node and/or by a gain switch comprised by the electrical interconnection between the diffusion node and the second capacitor. The transfer switch and the gain switch may be implemented as transistors. Thus, the electrical interconnection may be switchable. Since the transfer of the first amount of charge carriers is based on overflowing potential barriers, the transfer may occur even if the transfer switch and/or the gain switch are in an open, i.e. non-conductive state.

In an embodiment, the method further comprises, during a storage period, generating, at the diffusion node, an adjusted high light signal corresponding to the first amount of charge carriers and a reset level. A high light signal corresponds to the first amount of charge carriers. Thus, the high light signal might correspond to the excess charge carriers at saturation of the photodetector. Thus, the high light signal is generated if a light level is high. The reset level may contain KTC noise information of the pixel. Generating the adjusted high light signal can mean that the high light signal and the reset level are added. Since both high light signal and reset level are provided at the diffusion node, both signals are mixed.

In an embodiment, the method further comprises, during the storage period, buffering, via a first source follower, the adjusted high light signal from the diffusion node to the second capacitor. The first source follower decouples the photosensitive stage from the S/H stage. The first source follower is arranged in parallel to the electrical interconnection. Thus, the connection via the first source follower is different from the connection via the electrical interconnection. Buffering can mean that the respective signal is transferred to and stored on the respective capacitor. However, an altered version of the original signal may be stored on the respective capacitor. For example, the original signal may be attenuated or amplified, or may be transformed from a charge domain into a voltage domain. However, the stored signal is based on the original signal, such that the original signal can be reconstructed.

In an embodiment, the method further comprises, during the storage period, transferring a second amount of charge carriers from the photodetector to the diffusion node. The second amount of charge carriers may be an amount of charge carriers that remain at the photodetector during pixel exposure. This can mean that these charge carriers are not excess charge carriers. Thus, the second amount of charge carriers may refer to a low light signal. For example, if the light level is low, there may be no excess charge carriers at all. For example, transferring the second amount of charge carriers is initiated by activating the transfer switch between the photodetector and the diffusion node.

In an embodiment, the method further comprises, during the storage period, buffering the low light signal corresponding to the second amount of charge carriers from the diffusion node to a first capacitor of the sample-and-hold stage via the first source follower. The first capacitor may be arranged in parallel to the second capacitor. Alternatively, the first and the second capacitor are arranged cascaded. The first and the second capacitor may also be differently arranged. If the first and the second capacitor are arranged cascaded, the two capacitors are coupled to each other. For example, the adjusted high light signal may be redistributed between the first and the second capacitor. This can mean that the adjusted high light signal on the second capacitor is attenuated, for example by a factor of two if the capacitance of the first capacitor is equal to the capacitance of the second capacitor. However, for ease for readability it is still referred to as adjusted high light signal, since the original signal can be easily reconstructed.

In an embodiment, the method further comprises, during a readout period, reading, at a readout stage, the adjusted high light signal out from the second capacitor. In an embodiment, the method further comprises, during the readout period, reading the low light signal out from the first capacitor. The readout stage may comprise a second source follower and a select switch, as mentioned above. By applying the select switch, an electrical connection between the storage capacitors of the S/H stage and a column bus is established, such that the stored signals can be forwarded to a readout circuit.

By the above method of operation, the second capacitor is used for several purposes during operation of the pixel: For example, the second capacitor serves as overflow capacitor to temporarily store excess charge carriers. Further the second capacitor stores the adjusted high light signal including the reset level. A total number of storage capacitors can therefore be small, which reduces a total pixel size. In particular, the total number of storage capacitors may be exactly two in each pixel. The method of operating enables HDR operation, for example from about 60 dB up to 90 dB, or up to 100 dB or more than 100 dB. The HDR allows for better highlight and shadow capturing encountered in real world scenes, while maintaining the advantages of a global shutter (GS) implementation, such as low motion artifacts and reduced illumination times.

In an embodiment, a method for operating an imaging device comprising a plurality of pixels is provided. For each pixel of the plurality of pixels the method comprises, during an exposure period, accumulating, at a photosensitive stage, charge carriers by converting electromagnetic radiation with a photodetector. The method further comprises, during the exposure period, transferring a first amount of charge carriers from the photodetector via a diffusion node and an electrical interconnection to a second capacitor of a sample-and-hold stage. Further, the method comprises, during a storage period, generating, at the diffusion node, an adjusted high light signal corresponding to the first amount of charge carriers and a reset level. Further, the method comprises, during the storage period, buffering, via a first source follower, the adjusted high light signal from the diffusion node to the second capacitor. Further, the method comprises, during the storage period, transferring a second amount of charge carriers from the photodetector to the diffusion node, and buffering a low light signal corresponding to the second amount of charge carriers from the diffusion node to a first capacitor of the sample-and-hold stage via the first source follower. The method further comprises, during a readout period, reading, at a readout stage, the adjusted high light signal out from the second capacitor, and reading the low light signal out from the first capacitor.

In an embodiment, the first amount of charge carriers corresponds to an excess of charge carriers at saturation of the photodetector.

In an embodiment, generating the adjusted high light signal during the storage period comprises temporarily storing a high light signal corresponding to the first amount of charge carriers on the second capacitor. As mentioned above, the first amount of charge carriers is transferred to the second capacitor, where it may be temporarily stored as high light signal. In an embodiment, generating the adjusted high light signal during the storage period further comprises resetting the diffusion node, such that the reset level is generated. The reset level may be generated by resetting the diffusion node, e.g. by means of a reset switch that electrically connects the diffusion node with a pixel supply voltage, such that any redundant charge carriers are removed from the diffusion node. The reset level may contain KTC noise information of the pixel. In an embodiment, generating the adjusted high light signal during the storage period further comprises transferring the high light signal temporarily stored on the second capacitor to the diffusion node via the electrical interconnection. The high light signal can be transferred from the second capacitor back to the diffusion node via the switchable electrical interconnection. The transfer might be triggered by applying the gain switch included in the electrical interconnection, such that the electrical interconnection becomes conductive. The reset level might be generated before that transfer.

Thus, the reset level and the high light signal are both provided at the diffusion node and therefore mixed/added at the diffusion node to form the adjusted high light signal. Thus, the adjusted high light signal may be the sum of the high light signal and the reset level. This means that if the high light signal is "zero" (e.g. because no excess charge carriers are present, because the light level is low), the adjusted high light signal may "consist of" the reset level only. If the high light signal is zero, the low light signal may be used as pixel output signal. Correlated double sampling can be performed based on the low light signal and the reset level that is stored as part of the adjusted high light signal.

In an embodiment, during the storage period, the method further comprises resetting the second capacitor before buffering the adjusted high light signal to the second capacitor. In an embodiment, during the storage period, the method further comprises resetting the first capacitor before buffering the low light signal to the first capacitor. For example, resetting can be performed by means of a precharge switch. By applying the precharge switch (and conditionally further switches, i.e. the first switch and the second switch as mentioned above) the capacitors are electrically connected to a negative pixel supply voltage, and therefore discharged. Thus, new signals can be stored thereon.

In an embodiment, during the readout period after reading the low light signal from the first capacitor, the method further comprises resetting the diffusion node, such that a further reset level is generated at the diffusion node. As above, resetting the diffusion node can be conducted by means of the reset switch that electrically connects the diffusion node with a pixel supply voltage, such that any redundant charge carriers are removed from the diffusion node. The further reset level refers to a non-video signal of the pixel. By resetting the FD node, additional noise is introduced that is not correlated with the noise of the high or the low light signal. However, the further reset level may contain fixed pattern noise (FPN) information. Thus, advantageously, the FPN of the pixel can be determined.

In an embodiment, during the readout period after reading the low light signal from the first capacitor, the method further comprises resetting the second capacitor. As above, resetting the second capacitor can be conducted by means of the precharge switch that electrically connects the second capacitor with a supply voltage, such that the capacitor is discharged/refreshed. Thus, a further signal, in particular the further reset level, can be stored on the capacitor.

In an embodiment, during the readout period after reading the low light signal from the first capacitor, the method further comprises buffering the further reset level from the diffusion node to the second capacitor via the first source follower. As above, this can mean that the further reset level, or an altered version of the further reset level, is transferred to and stored on the second capacitor. Alternatively, the further reset level is buffered from the diffusion node via the first source follower to the first capacitor.

In an embodiment, during the readout period after reading the low light signal from the first capacitor, the method further comprises reading, at the readout stage, the further reset level out from the second capacitor (or, alternatively, from the first capacitor, if it is stored thereon). If the high light signal is used as pixel output signal, the further reset level can be used to perform double delta sampling (DDS). This can mean that the further reset level is used as a reference level for the high light signal. Here, thermal noise is less relevant since at high illuminance photon shot noise is dominant. Thus, correlated double sampling to remove thermal noise from the video signal is not necessary. However, it might be desired to remove the FPN from the video signal. By performing DDS, i.e. by using the further reset level as a reference level for the high light signal, the FPN can be removed.

In an embodiment, after the readout period, the method further comprises determining, based on the values of the adjusted high light signal and the low light signal, whether to use the adjusted high light signal, the low light signal, or a combination of both adjusted high light signal and low light signal as pixel output signal. This step can be performed by a control circuit outside the pixel. However, the control circuit can be comprised by the imaging device. For example, the control circuit can be comprised by the readout circuit or may be part of it. For example, if the control circuit evaluates that a value of the adjusted high light signal is greater than a threshold value, in particular greater than the reset level, the control circuit may determine that a light level is high. As such, the high light signal is determined as pixel output signal. On the other side, if the control circuit evaluates that the value of the adjusted high light signal is smaller than the threshold value, in particular if it consists of the reset level only, the control circuit may determine that the light level is low. As such, the low light signal is determined as pixel output signal. In addition or alternatively, the low light signal is evaluated similarly by using a further threshold value. By determining, based on the values of the adjusted high light signal and the low light signal, whether to use the adjusted high light signal or the low light signal as pixel output signal, the dynamic range of the pixel can be increased.

In an embodiment, the method further comprises using the reset level comprised by the adjusted high light signal as reference level, if the low light signal is used as pixel output signal, thus performing CDS. In an embodiment, the method further comprises using the further reset level as reference level if the adjusted high light signal is used as pixel output signal, thus performing DDS. By performing DDS and/or CDS the image quality can be enhanced, since various noise levels are taken into account.

In an embodiment, during the storage period, the high light signal is additionally temporarily stored on the first capacitor, such that the high light signal is distributed between the first capacitor and the second capacitor. For example, the first capacitor and the second capacitor are arranged cascaded. Then, the first capacitor is electrically coupled to the second capacitor via a switch (namely the second switch, as mentioned above). The first amount of charge carriers can be transferred to both capacitors by closing the second switch. Further, the high light signal, which corresponds to the first amount of charge carriers, can be temporarily stored on both capacitors. In other words, half of the high light signal can be stored on the first capacitor, and the other half of the high light signal can be stored on the first capacitor. Thus, the first amount of charge carriers, e.g. the amount of excess charge carriers, can be larger. As a consequence, by storing the high light signal on the first and the second capacitor, the dynamic range of the pixel can be doubled. However, this could come at the expense of increasing the signal-to-noise (SNR) dip between the low light signal and high light signal switching point.

In an embodiment, the method further comprises reducing a conversion gain of the pixel by activating the gain switch comprised by the electrical interconnection. The gain switch can be closed to shorten the diffusion node with the first terminal of the second capacitor. By shorting the FD node and the second capacitor a combined capacitance is larger than that of the FD node alone. Keeping the charge constant, this leads to a reduced voltage signal. Thus, the gain is reduced by enlarging the capacitance. This means that the pixel has a reduced gain if the FD node and the second capacitor are shorted. In other words, the pixel has an increased gain if the second capacitor is electrically decoupled from the FD node by the gain switch. Thus, a dynamic range of the pixel can be increased by applying different gains to charge signals from the photodetector. Thus, the second capacitor may act as low conversion gain capacitor.

Further embodiments of the method become apparent to the skilled reader from the embodiments of the imaging device described above, and vice-versa.

BRIEF DESCRIPTION OF THE DRAWINGS

The following description of figures may further illustrate and explain aspects of the imaging device and the method of operating such imaging device. Components and parts of the imaging device that are functionally identical or have an identical effect are denoted by identical reference symbols. Identical or effectively identical components and parts might be described only with respect to the figures where they occur first. Their description is not necessarily repeated in successive figures.

DETAILED DESCRIPTION

Figure 1:
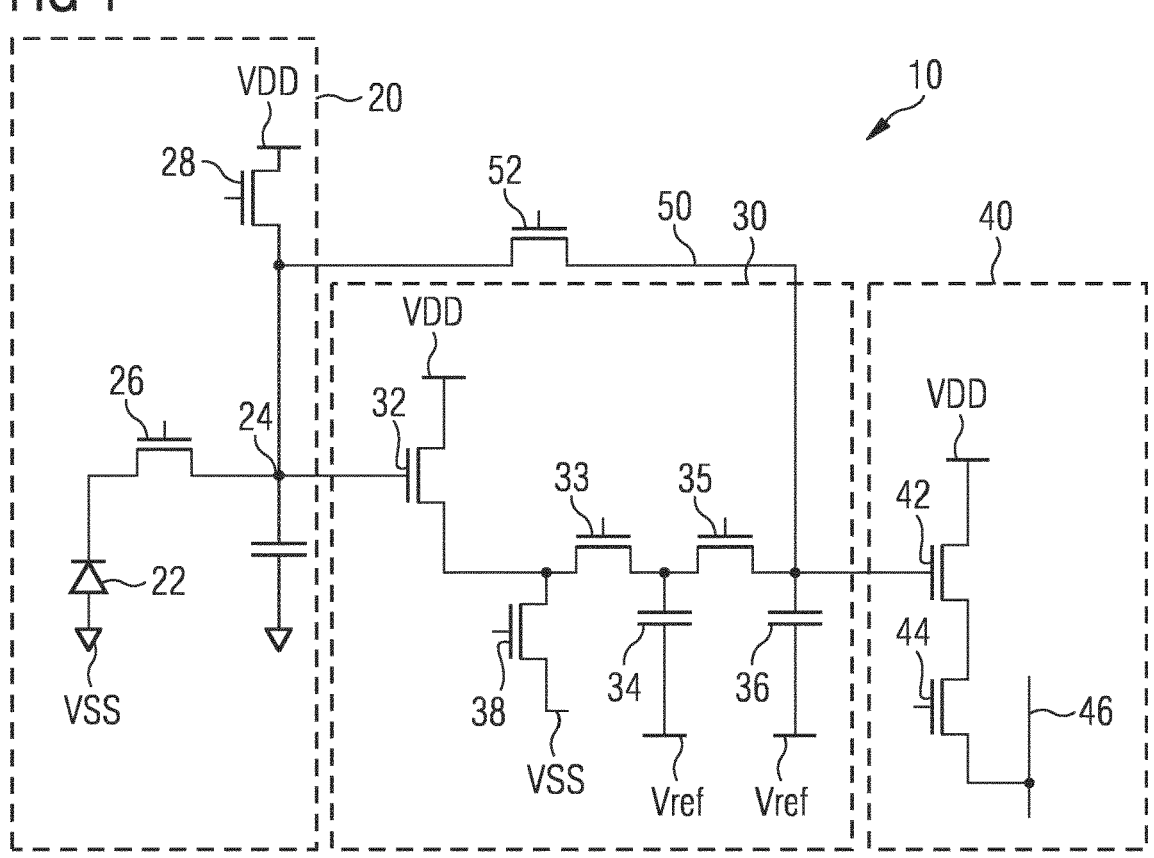
FIG. 1 shows an exemplary embodiment of a pixel comprised by an imaging device.

In FIG. 1 an exemplary embodiment of a pixel 10 is shown. The pixel 10 can be part of a plurality of pixels comprised by an imaging device 200. The imaging device 200 can be operated to achieve a high dynamic range (HDR).

The pixel 10 comprises a photosensitive stage 20, a sample-and-hold stage 30, and a readout stage 40. The photosensitive stage 20 comprises a photodetector 22 configured to accumulate charge carriers by converting electromagnetic radiation. Further, the photosensitive stage 20 comprises a diffusion node 24 that is electrically coupled to the photodetector 22 via a transfer switch 26.

The sample-and-hold stage 30, S/H stage 30, comprises a first source follower 32, wherein a gate terminal of the first source follower 32 is electrically connected to the diffusion node 24. Further, it comprises a switchable first capacitor 34 and a switchable second capacitor 36 that are electrically coupled to an output terminal of the first source follower 32.

The readout stage 40, comprises an input that is electrically coupled to an output of the sample-and-hold stage 30.

The pixel 10 further comprises an electrical interconnection 50 that comprises a gain switch 52, wherein a first terminal of the gain switch 52 is electrically connected to the diffusion node 24 and a second terminal of the gain switch 52 is electrically connected to a first terminal of the second capacitor 36. The gain switch 52 may be implemented as gain transistor 52. The gate of the gain transistor is configured to receive a gain signal DCG.

As shown in FIG. 1, the photodetector 22 may be implemented as photodiode 22. The photodiode 22 comprises an anode terminal and a cathode terminal. An anode terminal of the photodiode 22 is connected to a negative pixel supply voltage VSS, which can also be ground (GND). The photodiode 22 may convert light of any wavelength, for example visible light, infrared light and/or ultraviolet light.

The transfer switch 26 is arranged between the photodiode 22 and the diffusion node 24. In the embodiment shown in FIG. 1 the transfer switch 26 is implemented as transfer transistor 26. A first terminal of the transfer transistor 26 is electrically connected to the cathode terminal of the photodiode 22. A second terminal of the transfer transistor 26 is electrically connected to the diffusion node 24. A transfer gate of the transfer transistor 26 is configured to receive a transfer signal TG for transferring the respective charge signal from the photodiode 22 to the FD node 24.

The diffusion node 24 may be named floating diffusion (FD) node 24. The FD node 24 can be associated with a capacitance, which is indicated as capacitor symbol in FIG. 1, wherein a first terminal of the capacitor is electrically connected to VSS or GND, and a second terminal of the capacitor is formed by the FD node 24.

The pixel 10, in particular the photosensitive stage 20, further comprises a reset gate 28 electrically connected to the FD node 24 for resetting the FD node 24. In the embodiment shown in FIG. 1 the reset switch 28 is implemented as reset transistor 28. A first terminal of the reset transistor 28 is electrically connected to a positive supply voltage source VDD. A second terminal of the reset transistor 28 is electrically connected to the FD node 24. A reset gate of the reset transistor 28 is configured to receive a reset signal RST for resetting the FD node 24 by applying the supply voltage and therefore removing any redundant charge carriers.

In the S/H stage 30, the first source follower 32 may be implemented as common-drain amplifier 32. A gate terminal of the first source follower 32 is connected to the FD node 24 and serves as input terminal of the S/H stage. A drain terminal of the first source follower 32 is connected to the positive supply voltage source VDD. At an output terminal, which is the source terminal, of the first source follower 32, an electrical signal can be provided that is based on the charge signals at the FD node 24.

The first capacitor 34 may be configured to store a low light signal, and the second capacitor 36 may be configured to store a high light signal. The first capacitor 34 comprises a first terminal and a second terminal, wherein the second terminal may be connected to a reference voltage source Vref, as shown in FIG. 1. Further, the second capacitor 36 comprises a first terminal and a second terminal, wherein the second terminal may be connected to the reference voltage source Vref, too. The reference voltage source may also be VSS or GND.

The pixel 10, in particular the S/H stage 30, further comprises a first switch 33 between the source terminal of the first source follower 32 and the first terminal of the first capacitor 34. The first switch 33 may be implemented as first switching transistor 33. The first switching transistor 33 comprises a gate terminal configured to receive a first switch signal S1 for transferring an electrical signal towards the first capacitor 34. A first terminal of the first switching transistor 33 is electrically connected to the output terminal of the first source follower 32. A second terminal of the first switching transistor 33 is electrically connected to the first terminal of the first capacitor 34.

The pixel 10, in particular the S/H stage 30, further comprises a second switch 35 between the first terminal of the first capacitor 34 and the first terminal of the second capacitor 36. The second switch 35 may be implemented as second switching transistor 35. The second switching transistor 35 comprises a gate terminal configured to receive a second switch signal S2 for transferring an electrical signal towards the second capacitor 36. A first terminal of the second switching transistor 33 is electrically connected to the first terminal of the first capacitor 34. A second terminal of the second switching transistor 35 is electrically connected to the first terminal of the second capacitor 36.

The pixel 10 of FIG. 1, in particular the S/H stage 30, further comprises a precharge switch 38 electrically connected to the output terminal of the first source follower 32. The precharge switch 38 may be configured to precharge the first capacitor 34 and the second capacitor 36, which can in particular mean that the capacitors 34, 36 are discharged before new signals are stored. As shown in FIG. 1, the precharge switch 38 may be implemented as precharge transistor 38 comprising a first terminal connected to the output terminal of the first source follower 32 and a second terminal connected to VSS. By applying a precharge signal PC to a precharge gate of the precharge transistor 38 the capacitors 34, 36 are discharged.

The pixel 10 of FIG. 1, in particular the readout stage 40, further comprises a second source follower 42, which comprises a gate terminal electrically connected to the first terminal of the second capacitor 36. A drain terminal of the second source follower 42 is connected to VDD. A source terminal of the second source follower 42 serves as output terminal.

The readout stage 40 further comprises a select switch 44 between the output terminal of the second source follower 42 and a column bus 46. As shown, the select switch 44 may be implemented as select transistor 44 comprising a first terminal connected to the output terminal of the second source follower 42 and a second terminal connected to the column bus 46. By applying a select signal SEL to a select gate of the select transistor 44 the signals stored on the capacitors 34, 36 can be forwarded to the column bus 46. The column bus 46 may be common for all pixels 10 of a column of pixels 20 within the imaging device 200. The column bus 46 may lead to a readout circuit (not shown).

The pixel 10 of FIG. 1 can be operated as follows. It should however be noted different operating methods are possible that are not explicitly explained in the following. During an exposure period of the pixel 10 charge carriers are accumulated, at the photosensitive stage 20, by converting electromagnetic radiation with the photodetector 22. A first amount of charge carriers is transferred from the photodetector 22 via the diffusion node 24 and the electrical interconnection 50 to the second capacitor 36 of the sample-and-hold stage 30. The first amount of charge carriers may correspond to an excess of charge carriers at saturation of the photodetector 22. Thus, the second capacitor 36 (and possible also the first capacitor 34) may serve as overflow capacitors. During transfer of the first amount of charge carriers the transfer switch 26 as well as the gain switch 52 may be open, i.e. in a non-conductive state. Thus, the charge carriers have to overcome potential barriers. Charge carriers may overflow from the photodiode 22 to the second capacitor 36 only at high light conditions, i.e. when the photodiode 22 (and/or the diffusion node 24) saturates. When the light level is low, the charge carriers may remain in the potential well of the photodiode 22. The excess charge carriers may be temporarily stored as high light signal on the second capacitor 36.

Figure 2:
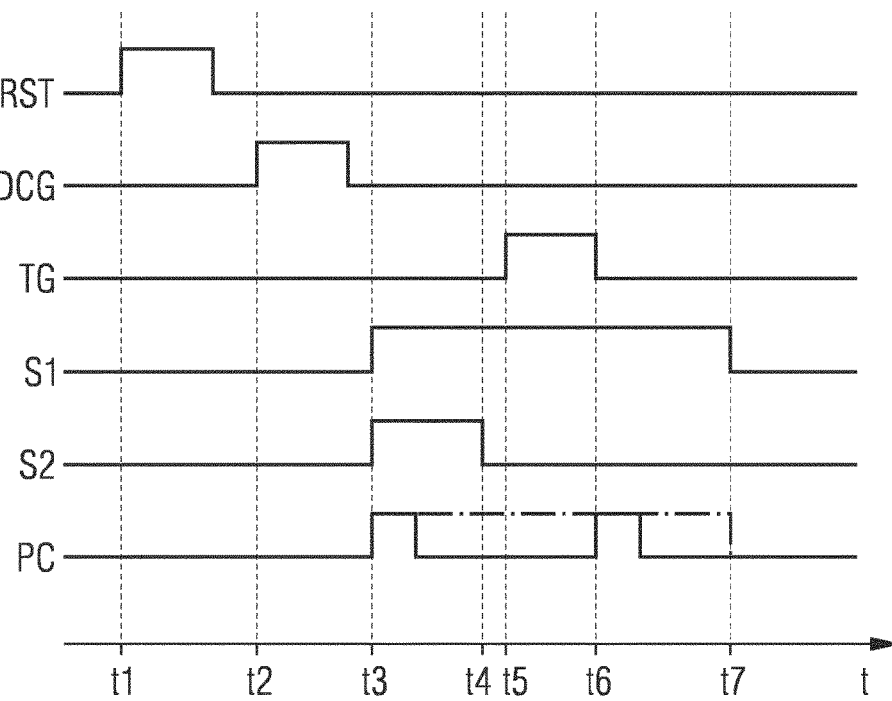
FIG. 2 shows an exemplary signal timing for the pixel according to FIG. 1.

The exposure period is followed by a storage period, which is illustrated in FIG. 2 in terms of signal timing. It should be noted that the signal timing shown is more of an example and could be varied. Furthermore, the scaling of the time intervals should not be taken as an exact indication. As the pixel 10 can be a global shutter pixel, the pixel exposure and frame storage can be a global operation, i.e. pixel exposure and frame storage can affect each pixel of an array of pixels simultaneously.

FIG. 2 shows the timing of the transfer signal TG, the reset signal RST, the first switch signal S1, the second switch signal S2, the precharge signal PC and the gain signal DCG. These signals can be in an activated state (high state) or in a deactivated state (low state). Applying or activating the respective signal can mean that the signal is switched to the activated state. Deactivating the respective signal can mean that the signal is switched to the deactivated state. In the following, the timing is explained in more detail using selected points in time t1-t7 shown in the figure.

As mentioned above, the high light signal corresponding to the first amount of charge carriers is temporarily stored on the second capacitor 36 (e.g. at time t0, not shown). At time t1 the diffusion node 24 is reset by applying the reset signal RST. Thus, a reset level is generated at the diffusion node 24.

At time t2 the high light signal temporarily stored on the second capacitor 36 is transferred to the diffusion node 24 via the electrical interconnection 50. This is achieved by applying the gain signal DCG at the gain switch 52 that is comprised by the electrical interconnection 50. At this point, since both the reset level and the high light signal are provided at the diffusion node 24, an adjusted high light signal corresponding to the first amount of charge carriers and a reset level is generated at the diffusion node 24.

At time t3 the first switch 33, the second switch 35 and the precharge switch 38 are activated (switch signals S1, S2 and precharge signal PC). By pulsing the precharge switch 38 the capacitors 34, 36 are refreshed. By activating the first switch signal S1 and the second switch signal S2 the adjusted high light signal is buffered from the diffusion node 24 via the first source follower 32 (but not via the electrical interconnection 50, since the gain signal DCG is deactivated) to the second capacitor 36. At time t4 the second switch signal S2 is deactivated, so that the adjusted high light signal is stored on the second capacitor 36.

At time t5 the transfer signal TG is activated, which means that a second amount of charge carriers is transferred from the photodetector 22 to the diffusion node 24. The second amount of charge carriers may correspond to charge carriers that remain on the potential well of the photodiode 22 during pixel exposure. At time t6 the precharge signal PC is pulsed again to refresh the first capacitor 34. Since the first switch signal S1 is still activated, a low light signal corresponding to the second amount of charge carriers is buffered from the diffusion node 24 via the first source follower 32 to the first capacitor 34 of the sample-and-hold stage 30. At time t7, by deactivating the first switch signal S1, the low light signal is stored on the first capacitor 34.

The described operation mode may be called starved mode of operation. FIG. 2 also shows an alternative mode, which may be called constant bias mode, and which is indicated in FIG. 2 by the dotted line in the precharge signal PC. In that case the first source follower 32 is constantly biased and constantly buffers the signal at the FD node 24 to its source terminal.

The storage period is followed by a readout period. Reading out pixels can be a local operation, since the pixels or rows of a pixel matrix can be read one after the other. During the readout period the adjusted high light signal is read out from the second capacitor 36. Further, the low light signal is read out from the first capacitor 34. Further, after reading the low light signal from the first capacitor 34, the diffusion node 24 and the second capacitor 36 may be reset, such that a further reset level is generated at the diffusion node 24. The further reset level may then be buffered from the diffusion node 24 to the second capacitor 36 via the first source follower 32, and also read out.

Figure 3:
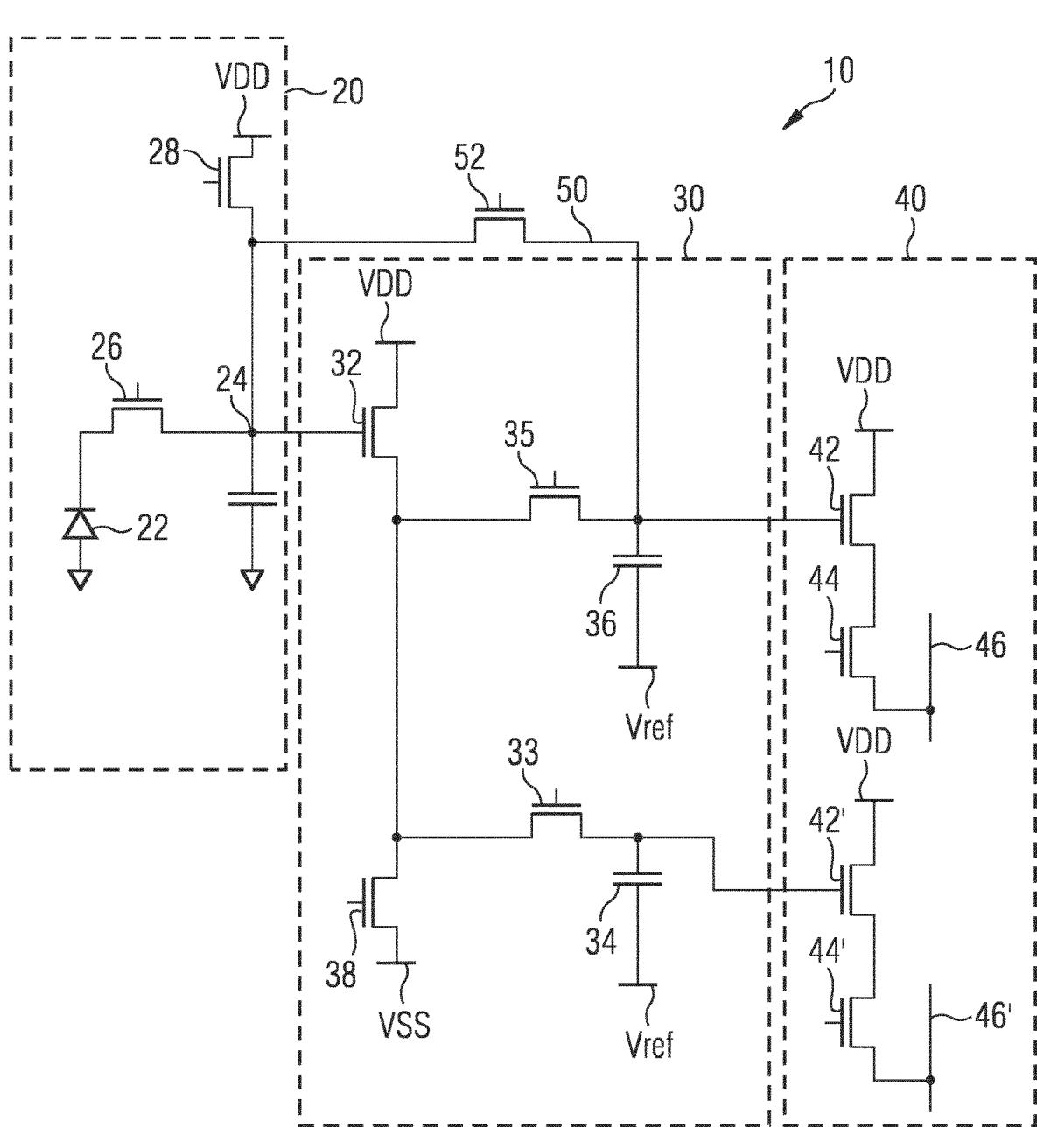
FIG. 3 shows another exemplary embodiment of a pixel comprised by an imaging device.

In FIG. 3 another embodiment of the pixel 10 is shown. The embodiment according to FIG. 3 is different from the embodiment according to FIG. 1 in that the capacitors 34, 36 are not arranged cascaded, but in parallel. This means that the second switch 35, which is coupled to the second capacitor 36, is directly connected to the output terminal of the first source follower 32, and not, as in FIG. 1, via the first switch 33.

It should be noted that the precharge switch 38 can also be implemented as constant current source configured to provide a fixed current.

Further, the embodiment according to FIG. 3 further comprises a further second source follower 42' and a further select switch 44'. The second source follower 42 and the select switch 44 are coupled to the second capacitor 36, while the further second source follower 42' and the further select switch 44' are coupled to the first capacitor 34. It should be noted, however, that the embodiment shown illustrates a parallel arrangement of the capacitors 34, 36 by way of example only. Other arrangements are possible. For example, the parallel arranged capacitors 34, 36 could share a common second source follower 42 by means of additional switches. It will be appreciated by a skilled person how to implement a similar signal timing as shown in FIG. 2. However, the signal timing may change slightly, since the first switch and the second switch can be operated independently.

Figure 4:
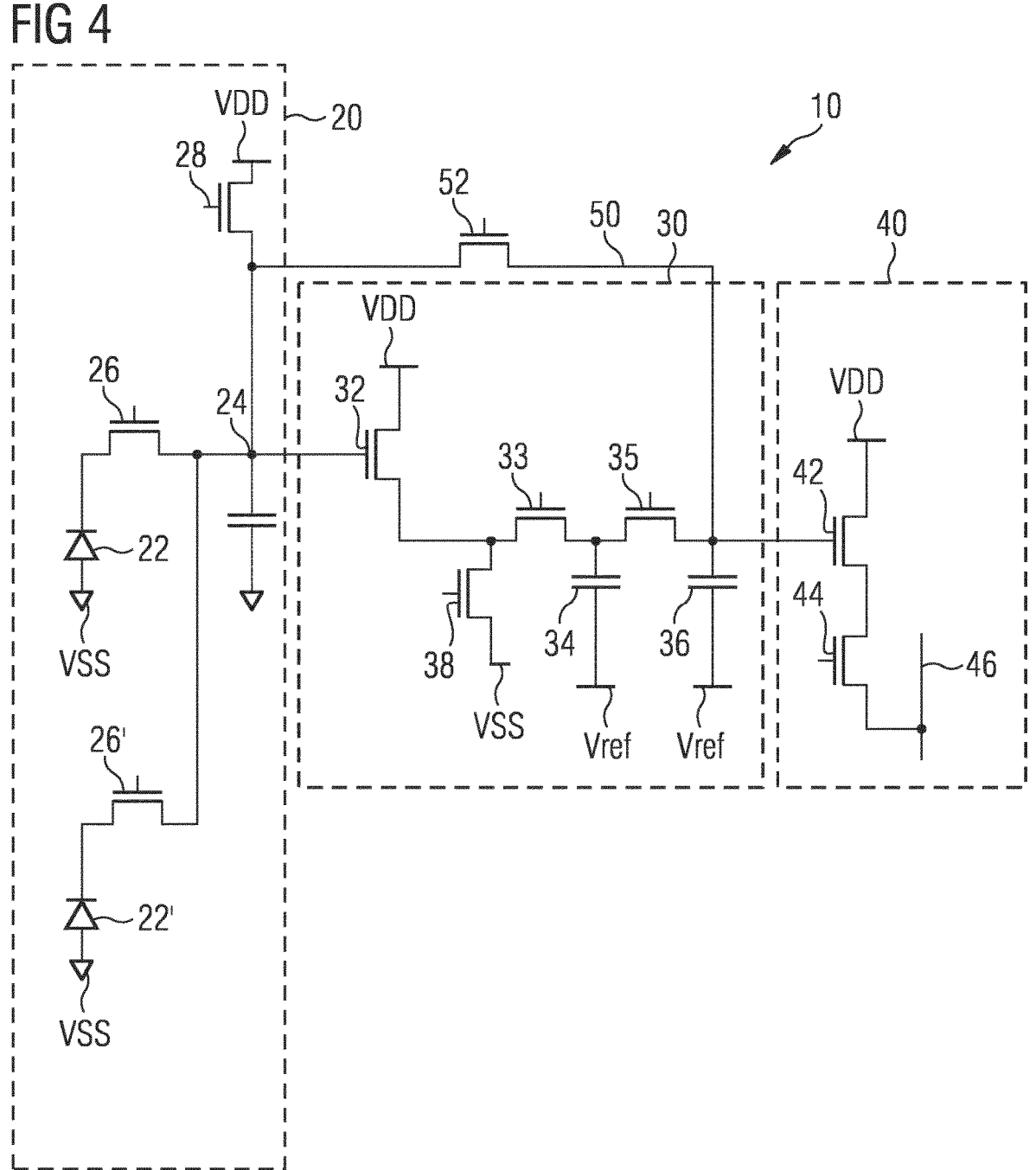
FIG. 4 shows another exemplary embodiment of a pixel comprised by an imaging device.

In FIG. 4 another embodiment of the pixel 10 is shown. The embodiment according to FIG. 4 is different from the embodiment according to FIG. 1 in that the pixel 10 further comprises a second photodiode 22', which is connected to the FD node 24 via a second transfer gate 26'. This means that the first photodiode 22 and the second photodiode 22' are arranged in parallel. The first photodiode 22 may be configured to generate the first amount of charge carriers, and the second photodiode 22' may be configured to generate the second amount of charge carriers. The first and the second photodiode 22, 22' can be different, which can mean that at a given illuminance the respective accumulated charges are different. For example, the second photodiode uses a different filter than the first photodiode.

The operation of such pixel 10 may be different from the above operating method. The transfer of the first amount of charge carriers from the first photodiode 22 to the diffusion node 24 may be performed in the storage period rather than in the exposure period. Further, the transfer may be initiated by activation of the transfer switch 26 rather than by an overflow of charge carriers. Thus, the second capacitor 36 can serve as a low conversion gain capacitor rather than an overflow capacitor. In that case, the gain switch may be closed, i.e. in a conducting state.

Figure 5:
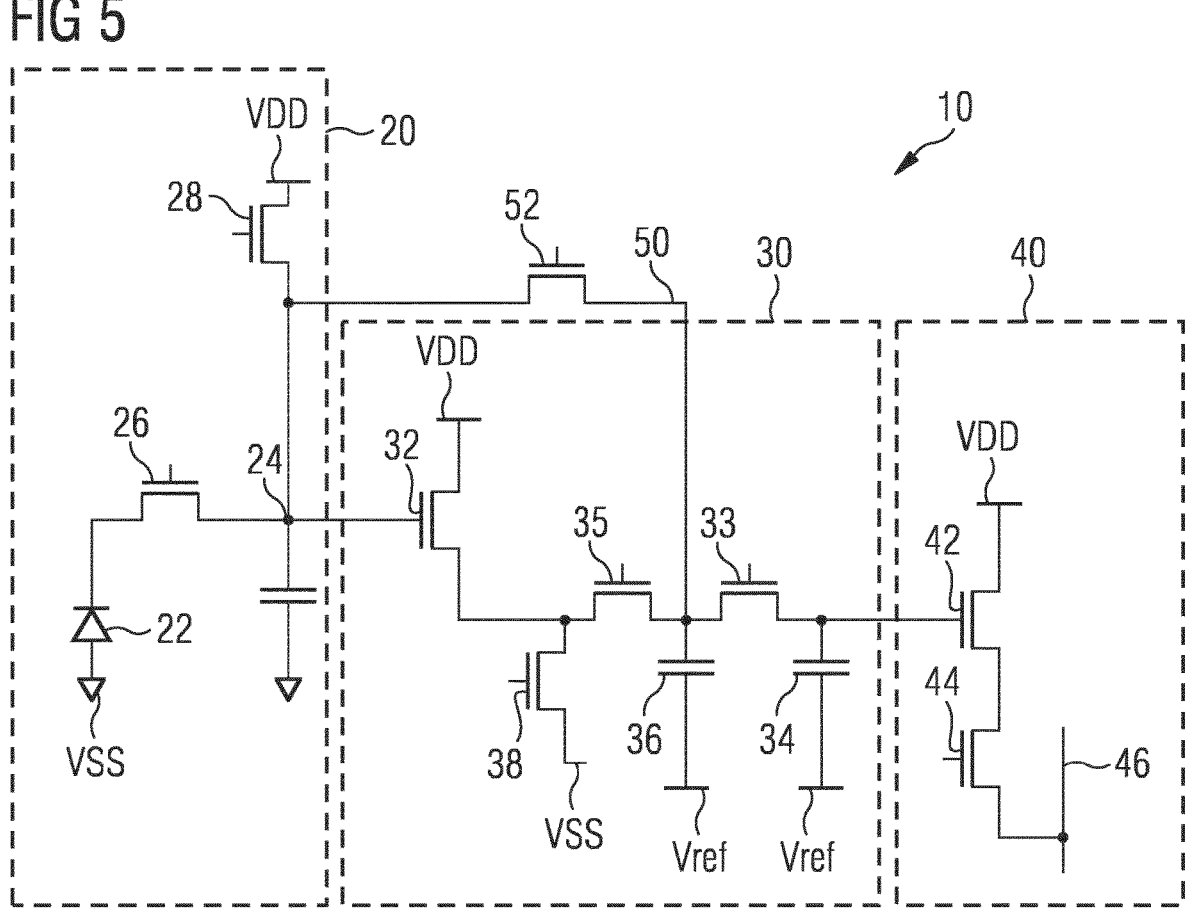
FIG. 5 shows another exemplary embodiment of a pixel comprised by an imaging device.

In FIG. 5 another embodiment of the pixel 10 is shown. The embodiment according to FIG. 5 is different from the embodiment according to FIG. 1 in that the first capacitor 34 and the second capacitor 36 (and their respective switches 33, 35) are arranged the other way around. This means that the second switch 35 is connected between the source terminal of the first source follower 32 and the first terminal of the second capacitor 36. The first switch 33 is connected between the first terminal of the first capacitor 34 and the first terminal of the second capacitor 36. The first terminal of the first capacitor 34 forms the output of the S/H stage 30. The electrical interconnection 50 comprising the gain switch 52 is arranged such that the first terminal of the gain switch 52 is electrically connected to the diffusion node 24 and the second terminal of the gain switch 52 is electrically connected to the first terminal of the second capacitor 36, which is, in this cascaded arrangement, arranged between the source terminal of the first source follower 32 and the first terminal of the first capacitor 34.

The embodiment according to FIG. 5 can also be seen in such a way that the electrical connection 50 connects the diffusion node 24 with a first of two cascaded arranged capacitors, while in the embodiment of FIG. 1 the electrical connection 50 connects the diffusion node 24 with a second of two cascaded arranged capacitors.

Figure 6:
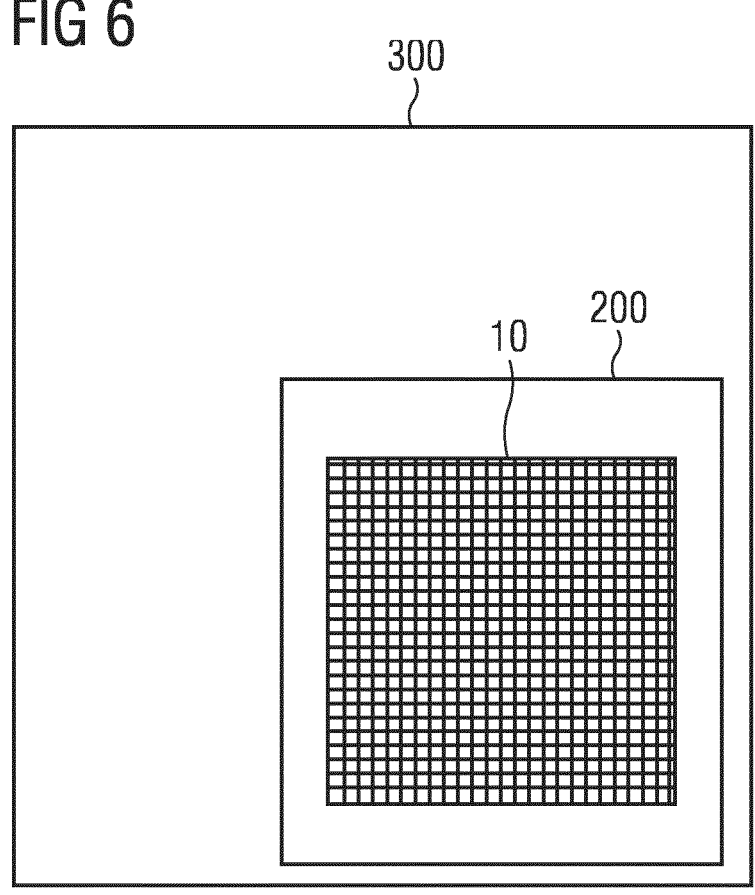
FIG. 6 shows a schematic of an optoelectronic device comprising an imaging device.

In FIG. 6 an optoelectronic device 300 comprising the imaging device 200 is shown schematically. Pixels 10 of the imaging device 200 can be arranged in a two-dimensional pixel matrix, as indicated in FIG. 5. The optoelectronic device 300 may comprise further components (not shown), for example other circuit elements or a light source that is synchronized with the pixels 10.

The embodiments of the imaging device 200 and the method of operating such imaging device 200 disclosed herein have been discussed for the purpose of familiarizing the reader with novel aspects of the idea. Although various embodiments have been shown and described, many changes, modifications, equivalents and substitutions of the disclosed concepts may be made by one having skill in the art without unnecessarily departing from the scope of the claims.

It will be appreciated that the disclosure is not limited to the disclosed embodiments and to what has been particularly shown and described hereinabove. Rather, features recited in separate dependent claims or in the description may advantageously be combined. Furthermore, the scope of the disclosure includes those variations and modifications, which will be apparent to those skilled in the art and fall within the scope of the appended claims.

The term "comprising", insofar it was used in the claims or in the description, does not exclude other elements or steps of a corresponding feature or procedure. In case that the terms "a" or "an" were used in conjunction with features, they do not exclude a plurality of such features. Moreover, any reference signs in the claims should not be construed as limiting the scope.

REFERENCE SYMBOLS

10 pixel
20 photosensitive stage
22 photodetector, first photodiode
22' second photodiode
24 diffusion node 26, 26' transfer switch
28 reset switch
30 sample-and-hold stage
32 first source follower
33 first switch
34 first capacitor
35 second switch
36 second capacitor
38 precharge switch
40 readout stage
42 second source follower
42' further second source follower
44 select switch
44' further select switch
46, 46' column bus
50 electrical interconnection
52 gain switch
200 imaging device
300 optoelectronic device
DCG gain signal
PC precharge signal
RST reset signal
S1 first switch signal
S2 second switch signal
t1-t7 time points
TG transfer signal
VDD positive supply voltage source
Vref reference voltage source
VSS negative supply voltage source

What is claimed is:

1. An imaging device comprising a plurality of pixels, each pixel of the plurality of pixels comprising:
   a photosensitive stage, comprising a photodetector configured to accumulate charge carriers by converting electromagnetic radiation, and a diffusion node electrically coupled to the photodetector via a transfer switch;
   a sample-and-hold stage, comprising a first source follower, wherein a gate terminal of the first source follower is electrically connected to the diffusion node, and further comprising a switchable first capacitor and a switchable second capacitor that are electrically coupled to an output terminal of the first source follower;
   a readout stage, wherein an input of the readout stage is electrically coupled to an output of the sample-and-hold stage; and
   an electrical interconnection comprising a gain switch, wherein a first terminal of the gain switch is electrically connected to the diffusion node and a second terminal of the gain switch is electrically connected to a first terminal of the second capacitor,
   wherein the second capacitor is configured to temporarily store a high light signal corresponding to a first amount of charge carriers generated by the photodetector, and wherein the first capacitor is configured to store a low light signal corresponding to a second amount of charge carriers generated by the photodetector.

2. The imaging device according to claim 1, wherein the second capacitor is configured to store an adjusted high light signal corresponding to a first amount of charge carriers generated by the photodetector and a reset level.

3. The imaging device according to claim 1, wherein the gain switch is configured to short the diffusion node and the first terminal of the second capacitor.

4. The imaging device according to claim 1, wherein, in the sample-and-hold stage, a first terminal of the first capacitor is electrically coupled to an output terminal of the first source follower via a first switch, and the first terminal of the second capacitor is electrically coupled to the first terminal of the first capacitor via a second switch and forms an output of the sample-and-hold stage.

5. The imaging device according to claim 1, wherein the photosensitive stage further comprises a reset switch that is electrically connected between the diffusion node and a positive supply voltage source.

6. The imaging device according to claim 1, wherein the sample-and-hold stage further comprises a precharge switch that is electrically connected between the output terminal of the first source follower and a negative supply voltage source.

7. The imaging device according to claim 1, wherein a second terminal of the first capacitor and a second terminal of the second capacitor are electrically connected to a reference voltage source.

8. The imaging device according to claim 1, wherein the readout stage comprises a second source follower, wherein a gate terminal of the second source follower is electrically connected to the output of the sample-and-hold stage, and further comprises a select switch, wherein the select switch is electrically connected between an output terminal of the second source follower and a column bus of the imaging device.

9. An optoelectronic device comprising the imaging device according to claim 1.

10. A method for operating an imaging device comprising a plurality of pixels, for each pixel of the plurality of pixels the method comprising:
   during an exposure period:
      accumulating, at a photosensitive stage, charge carriers by converting electromagnetic radiation with a photodetector,
      transferring a first amount of charge carriers from the photodetector via a diffusion node and an electrical interconnection to a second capacitor of a sample-and-hold stage;
   during a storage period:
      generating, at the diffusion node, an adjusted high light signal corresponding to the first amount of charge carriers and a reset level,
      buffering, via a first source follower, the adjusted high light signal from the diffusion node to the second capacitor,
      transferring a second amount of charge carriers from the photodetector to the diffusion node, and
      buffering, via the first source follower, a low light signal corresponding to the second amount of charge carriers from the diffusion node to a first capacitor of the sample-and-hold stage; and
   during a readout period:
      reading, at a readout stage, the adjusted high light signal out from the second capacitor, and
      reading, at the readout stage, the low light signal out from the first capacitor.

11. The method for operating an imaging device according to claim 10, wherein the first amount of charge carriers corresponds to an excess of charge carriers at saturation of the photodetector.

12. The method for operating an imaging device according to claim 10, wherein, during the storage period, generating the adjusted high light signal comprises:
   temporarily storing a high light signal corresponding to the first amount of charge carriers on the second capacitor, resetting the diffusion node, such that the reset level is generated, and transferring the high light signal temporarily stored on the second capacitor to the diffusion node via the electrical interconnection.

13. The method for operating an imaging device according to claim 10, further comprising during the storage period:

before buffering the adjusted high light signal to the second capacitor, resetting the second capacitor, and before buffering the low light signal to the first capacitor, resetting the first capacitor.

14. The method for operating an imaging device according to claim 10, further comprising during the readout period after reading the low light signal from the first capacitor:

resetting the diffusion node and the second capacitor, such that a further reset level is generated at the diffusion node, buffering the further reset level from the diffusion node to the second capacitor via the first source follower, and reading, at the readout stage, the further reset level out from the second capacitor.

15. The method for operating an imaging device according to claim 14, further comprising after the readout period: determining, based on the values of the adjusted high light signal and the low light signal, whether to use the adjusted high light signal, the low light signal, or a combination of both signals as pixel output signal.

16. The method for operating an imaging device according to claim 15, further comprising:

if the low light signal is used as pixel output signal, perform correlated double sampling, CDS, using the reset level comprised by the adjusted high light signal as reference level, and if the adjusted high light signal is used as pixel output signal, perform double delta sampling, DDS, using the further reset level as reference level.

17. The method for operating an imaging device according to claim 12, wherein, during the storage period, the high light signal is additionally temporarily stored on the first capacitor, such that the high light signal is distributed between the first capacitor and the second capacitor.

18. The method for operating an imaging device according to claim 10, further comprising: reducing a conversion gain of the pixel by activating a gain switch comprised by the electrical interconnection.

19. An imaging device comprising a plurality of pixels, each pixel of the plurality of pixels comprising:

a photosensitive stage, comprising a photodetector configured to accumulate charge carriers by converting electromagnetic radiation, and a diffusion node electrically coupled to the photodetector via a transfer switch;

a sample-and-hold stage, comprising a first source follower, wherein a gate terminal of the first source follower is electrically connected to the diffusion node, and further comprising a switchable first capacitor and a switchable second capacitor that are electrically coupled to an output terminal of the first source follower;

a readout stage, comprising a second source follower and a select switch, wherein a gate terminal of the second source follower is electrically connected to an output of the sample-and-hold stage, and wherein the select switch is electrically connected between an output terminal of the second source follower and a column bus of the imaging device; and an electrical interconnection comprising a gain switch, wherein a first terminal of the gain switch is electrically connected to the diffusion node and a second terminal of the gain switch is electrically connected to a first terminal of the second capacitor.

* * * * *